United States Patent [19]
Shirakawabe et al.

[11] Patent Number: 5,992,225
[45] Date of Patent: Nov. 30, 1999

[54] CANTILEVER PROBE AND SCANNING TYPE PROBE MICROSCOPE UTILIZING THE CANTILEVER PROBE

[75] Inventors: Yoshiharu Shirakawabe; Nobuhiro Shimizu; Hiroshi Takahashi, all of Chiba, Japan

[73] Assignee: Seiko Instruments Inc., Japan

[21] Appl. No.: 08/987,734

[22] Filed: Dec. 9, 1997

[30] Foreign Application Priority Data

Dec. 10, 1996 [JP] Japan .................................. 8-329877

[51] Int. Cl.⁶ .................................................. G01B 7/34
[52] U.S. Cl. .................................................. 73/105
[58] Field of Search ................................ 73/104, 105

[56] References Cited

U.S. PATENT DOCUMENTS

| | | | |
|---|---|---|---|
| 5,239,863 | 8/1993 | Kado et al. | 73/105 |
| 5,336,369 | 8/1994 | Kado et al. | 156/659.1 |
| 5,367,165 | 11/1994 | Toda et al. | 250/306 |
| 5,400,647 | 3/1995 | Elings | 73/105 |
| 5,418,363 | 5/1995 | Elings et al. | 73/105 |

FOREIGN PATENT DOCUMENTS

| | | |
|---|---|---|
| 701102A1 | 3/1996 | European Pat. Off. . |
| WO9212398 | 7/1992 | WIPO . |
| WO9503561 | 2/1995 | WIPO . |

OTHER PUBLICATIONS

Patent Abstracts of Japan, vol. 097, No. 008 Aug. 28, 1997.
Patent Abstracts of Japan, vol. 097, No. 003 Mar. 31, 1997.

*Primary Examiner*—Max Noori
*Attorney, Agent, or Firm*—Adams & Wilks

[57] ABSTRACT

A cantilever probe for scanning a sample surface comprises a cantilever having a free end and a fixed end. A first support section is disposed at the free end and extends along a first plane. A probe is formed on the first support section for scanning movement relative to the sample surface. A second support section is disposed at the fixed end and extends along a second plane different from the first plane. A beam section interconnects the first support member and the second support member to one another and extends along a third plane different from the first and second planes.

34 Claims, 5 Drawing Sheets

CANTILEVER PROBE AND SCANNING TYPE PROBE MICROSCOPE UTILIZING THE CANTILEVER PROBE

BACKGROUND OF THE INVENTION

The present invention relates to a cantilever probe and a method of manufacturing the same, and more particularly to a cantilever probe and a method of manufacturing the same suitable for a scanning type probe microscope represented by the AFM (Atomic Force Microscope). Further, to describe more specifically, the present invention relates to a cantilever probe and a method of manufacturing the same in which a probe approaching the surface of a sample to be scanned thereby is provided at a free edge of the cantilever and a beam section thereof is deflected by force generated between the probe and the surface of the sample. Also, the present invention relates to observation, when a surface of a sample existing in a liquid is to be observed, of the surface of the sample with an optical lever reflecting section of the cantilever probe kept above the liquid. The present invention also relates to a scanning type probe microscope utilizing the cantilever probe.

A cantilever with a probe provided at a free edge of a beam section thereof supported in a cantilever form has been used as a scanning probe in a scanning type atomic force microscope (AFM). In the cantilever probe having the configuration as described above, when a surface of a sample is scanned with the probe, an attractive force or a repulsive force according to an interatomic force is generated between the sample surface and the probe, so that a form of the sample surface can be measured by detecting the interatomic force as a deflection rate of the cantilever.

A conventional type cantilever probe for an AFM is disclosed in, for instance, Japanese Patent Laid-Open Publication No. HEI 5-196458, in which the cantilever probe 30 has a linear form as a whole as shown in FIG. 5A and both a free edge 30b at which a probe 1 is formed and a fixed edge 30c fixed to a main body of a microscope are present on an extension line of a beam section 30a of the cantilever. However, when the linear cantilever 30 as described above is used for a scanning probe, if the cantilever is arranged in a posture that the beam section 30a is parallel to the surface of a sample, the beam section 30a may contact the surface of the sample if the sample has a largely wavy surface, whereby the probe 1 can not accurately trace the surface of the sample. For this reason, the cantilever probe 30 based on the conventional technology was attached to the main body thereof at an angle, as shown in FIG. 5B, toward the surface of a sample so that the probe 1 can accurately trace the surface thereof without contacting of the beam section 30a with the sample 20 even if the sample has a largely wavy surface.

Also, when a sample in a liquid is to be measured with the conventional type AFM, an entire cantilever probe is required to be sunk in the liquid and a lever section as a reflecting surface of an optical lever is also in the liquid, which makes it difficult to adjust a position of a laser, or a reflecting position is changed due to its refraction, absorption, or change in a liquid surface, so that reflection intensity becomes weaker or accurate measurement can not be carried out.

As described above, when the cantilever probe 30 is attached at an angle toward a surface of a sample, the probe 1 approaches the surface of the sample also at an angle toward it. FIG. 6 is a simulated view showing an interatomic force when the probe 1 approaches the surface thereof at an angle toward it, and it is clear that the interatomic force does not uniformly apply to to the probe 1 in the posture shown in the figure. For this reason, a deflection rate of the cantilever probe 30 cannot accurately represent a distance between the probe 1 and the sample 20, so that the sensitivity is reduced and a measurement error becomes larger. Also, when a sample in a liquid is to be measured, as the entire cantilever probe is sunk in the liquid, a laser for detecting an optical lever is reflected on a liquid surface or absorbed by the liquid, and also reflection intensity of a laser drops or a reflecting position is displaced, which makes it impossible to perform correct or high sensitivity detection.

The present invention was made for solving the problems relating to the conventional technology, and it is an object of the prevent invention to provide a cantilever probe and a method of manufacturing the same in which, even if a probe formed at a free edge vertically approaches a surface of a sample to be scanned thereby, the probe can accurately trace the surface thereof with the main body of the cantilever probe not contacting the surface thereof. Further, it is another object of the present invention to provide a cantilever probe and a method of manufacturing the same in which accurate observation of a sample in a liquid can be performed, when a sample in a liquid is to be observed, because a laser reflecting surface of the cantilever does not sink in the liquid. Another object of the present invention is to provide a scanning type probe microscope utilizing the cantilever probe.

SUMMARY OF THE INVENTION

To achieve the objects described above, in the present invention, the following countermeasures are taken in a cantilever probe with a probe provided at a free edge of a beam section supported in a cantilever form and in a method of manufacturing the same.

(1) In the present invention, a bending section is provided in at least one position between a fixed edge and a free edge of the beam section so that the beam section is inclined by a prespecified angle toward a surface of a sample in a state where the probe is close to the surface thereof in the vertical direction.

(2) The method according to the present invention comprises a step of forming a pair of protection coats in one edge of a surface as well as in the other edge of the rear surface of a semiconductor substrate respectively with a specified gap provided therebetween so that projections from both of the sections are not superimposed on each other, a step of executing anisotropic etching to the silicon substrate from the top surface as well as from the rear surface thereof to a specified depth using the protection coat as a mask to form a non-linear cantilever comprising two supporting sections remained under the pair of protection coats and a beam section remained in the gap area so as to connect the supporting sections to each other therethrough, a step of forming a protection coat on the surface of one of the supporting sections, and a step of forming a probe by under-cutting the surface of the supporting section under the protection coat by subjecting it to isotropic etching.

(3) The method according to the present invention comprises a step of subjecting a surface of a silicon substrate to anisotropic etching to form a concave form with the bottom of the concave section formed into a lever section of the bent cantilever, a step of setting a gap between the cantilever and the peripheral section to some $\mu$m, and a step of forming a probe at a rear surface of the lever section by subjecting it to isotropic etching.

With the cantilever having the configuration (1) as described above, even if the probe has vertically approached a surface of a sample, contact between the main body of the cantilever and the surface of the sample can be prevented, which allows the probe to accurately trace the surface thereof. With the method of manufacturing the cantilever according to the configuration (2) and the configuration (3) as described above, a non-linear cantilever probe having a bending section(s) can be formed only by chemical etching steps without requiring complicated polishing steps which are required in mechanical processing.

With the cantilever probe according to the configuration (3), as an entire cantilever probe is not required to be sunk in a liquid when a sample in the liquid is to be observed, accurate observation of a sample in a liquid can be performed because attenuation of a laser for detecting a position due to reflection on the surface of the liquid or absorption thereby does not occur or displacement of a laser does not also occur more than the displacement due to interaction between the probe and the sample due to its irregular reflection.

DETAILED DESCRIPTION OF THE INVENTION

Figure 1:
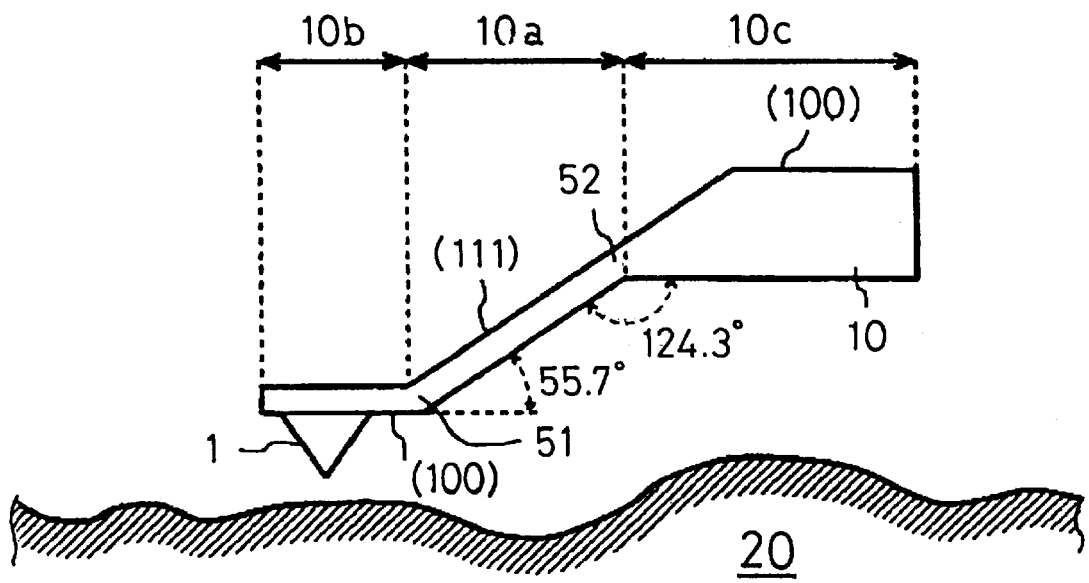
FIG. 1 is a side view of a cantilever probe according to one embodiment of the present invention.

Detailed description is made hereinafter for the present invention with reference to the drawings. FIG. 1 is a side view of a cantilever probe according to one embodiment of the present invention, and the same reference numerals are assigned to the sections identical or corresponding to those in FIG. 1.

Figure 2:
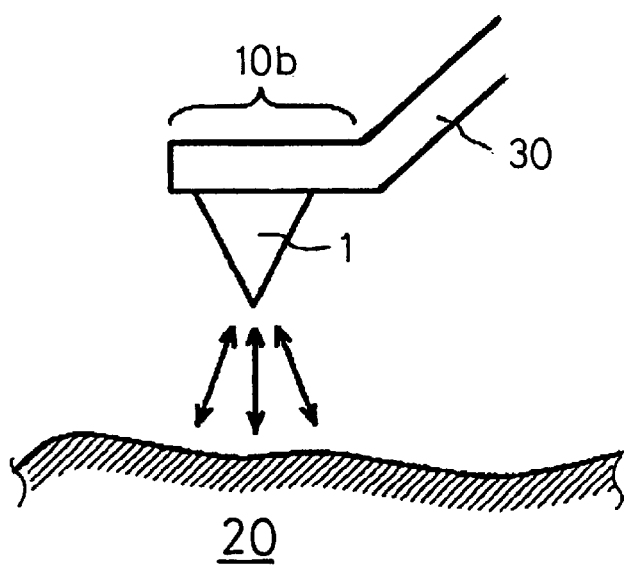
FIG. 2 is a simulated view showing actions of an interatomic force when the probe has vertically approached the surface of the sample.

A cantilever probe 10 according to the present invention is constructed by subjecting a silicon substrate to etching, and has three areas with bending sections 51 and 52 each as a boundary therebetween respectively such as a supporting section 10b in the side of a free edge, a beam section 10a, and a supporting section 10c in the side of a fixed edge. A probe 1 is formed in the free edge side supporting section 10b and the fixed edge side supporting section 10c is fixed to a main body of a microscope. An angle between free edge side supporting section 10b and the beam section 10a is around 55.7° at the bending section 51, and an angle between the beam section 10a and the fixed edge side supporting section 10c is around 124.30° at the bending section 52. The free edge side supporting section 10b and the fixed edge side supporting section 10c are not present on the same plane but are parallel to each other, and the <100> plane is exposed on each surface of the supporting sections. Also, the <111> plane is exposed on the surface of the beam section 10a. With the non-linear cantilever probe as described above, the probe 1 can vertically approach a surface of a sample with the beam section 10a not contacting the surface thereof even if the sample has a comparatively large wavy surface. FIG. 2 is a simulated view showing actions of interatomic force when the probe 1 has vertically approached the surface of the sample, and the interatomic force is uniformly applied to the probe 1 in the posture shown in the figure, so that a deflection rate of the cantilever 30 can accurately represent a distance between the probe 1 and the sample 20.

FIG. 3A–3C and FIG. 4A–4B are cross-sectional views each showing a method of manufacturing the non-linear cantilever probe having two bending sections as described above, and the same reference numerals are also assigned to sections identical or corresponding to those in the previous figures. At first, masks 61, 62 such as an oxide film are formed in one edge of the top surface as well as in the other edge of the rear surface of the silicon substrate 3 which is a <100> plane respectively (Refer to FIG. 3A). The masks 61, 62 are arranged with a specified gap d provided therebetween so that projections from both of the sections are not superimposed on each other. The gap d in this case is decided according to a crystal structure of a material of the substrate (silicon in this embodiment), a thickness of the substrate, and a thickness of a section as a beam section 30a or the like.

Figure 3A:
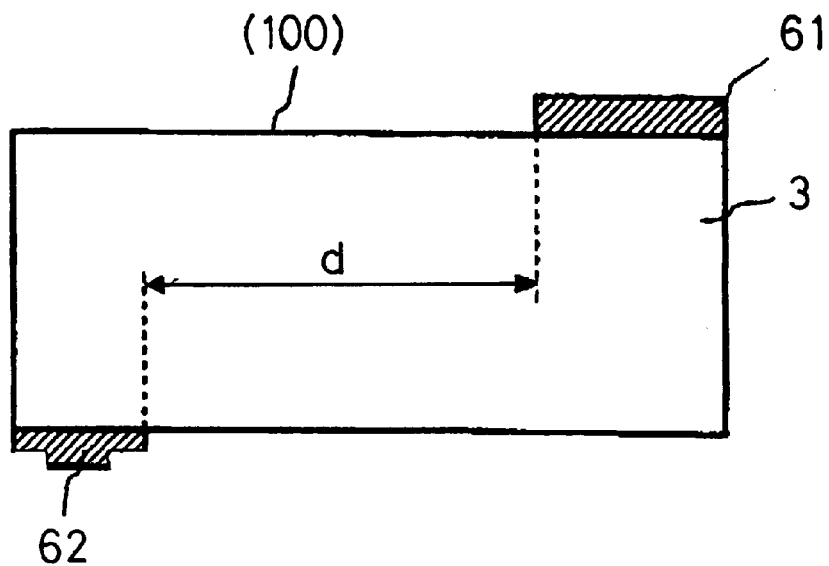
FIGS. 3A–3C are a view (Part one) showing a method of manufacturing a non-linear cantilever probe according to one embodiment of the present invention.
Figure 3B:
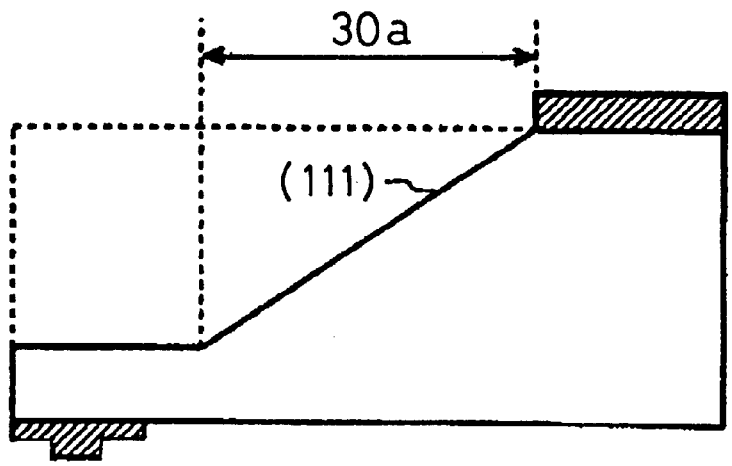

Then, the top surface of the silicon substrate 3 is subjected to anisotropic wet etching as far as a specified depth using the mask 61 as a mask (Refer to FIG. 3B). As a solvent for etching, a 40 weight percent aqueous solution of potassium hydroxide (KOH) can be used at a temperature in a range from 60° C. to 80° C. and a 20 weight percent aqueous solution of tetramethylammonium hydroxide (TMAH) at a temperature in a range from 80° C. to 90° C. or the like. In those types of solvent for etching, the <100> plane is subjected to etching much quicker than the <111> plane, so that the mask 61 is practically not affected by etching. Accordingly, this anisotropic etching is practically stopped at the <111> plane with the edge section of the mask 61 as a reference, and the <111> plane is exposed in a gap area which is the beam section 30a.

Figure 3C:
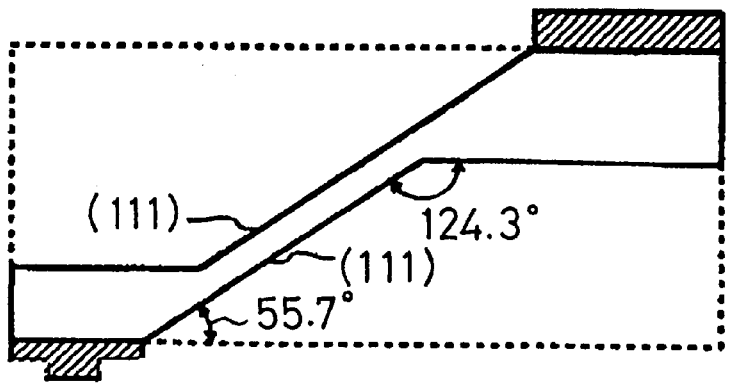

When a rear surface of the silicon substrate is also subjected to anisotropic wet etching as the top surface thereof, the <111> plane with the edge section of the mask 62 as a reference is exposed in the gap area (Refer to FIG. 3C). When the silicon substrate 3 is used as in this embodiment, there is generated an angle of around 55.7° (around 124.3°) between the <100> plane and the <111> plane.

Figure 4A:
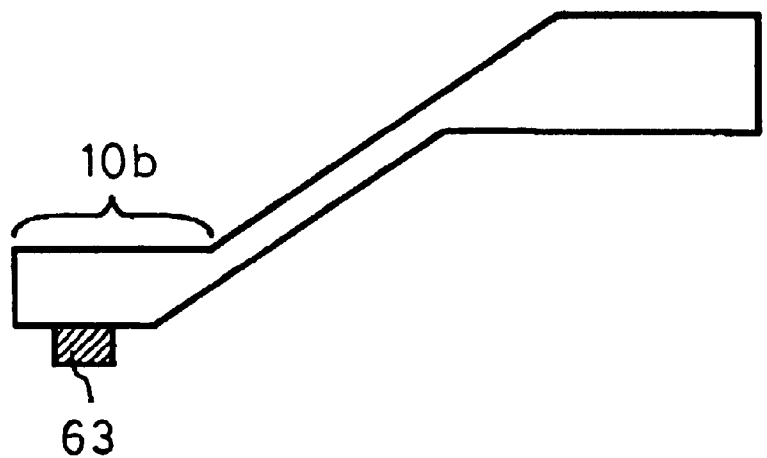
FIGS. 4A–4B are a view (Part two) showing a method of manufacturing a non-linear cantilever probe according to one embodiment of the present invention.
Figure 4B:
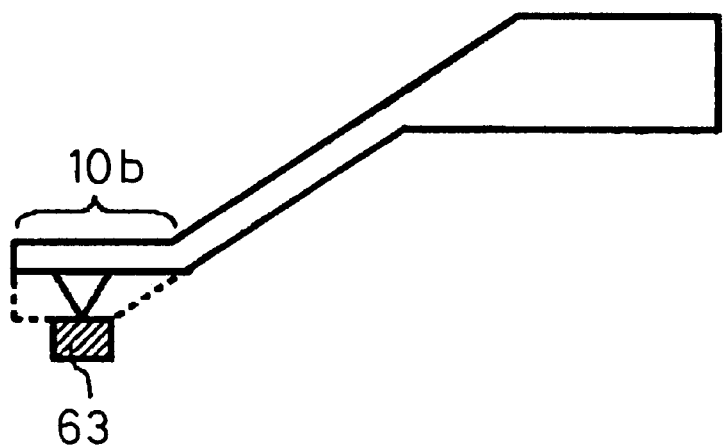
Figure 5A:
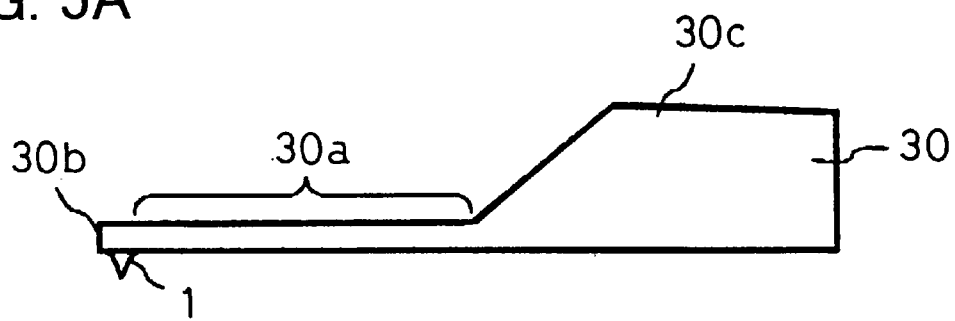
FIGS. 5A–5B are a view showing a structure of the linear cantilever probe based on the conventional technology and a usage thereof.
Figure 5B:
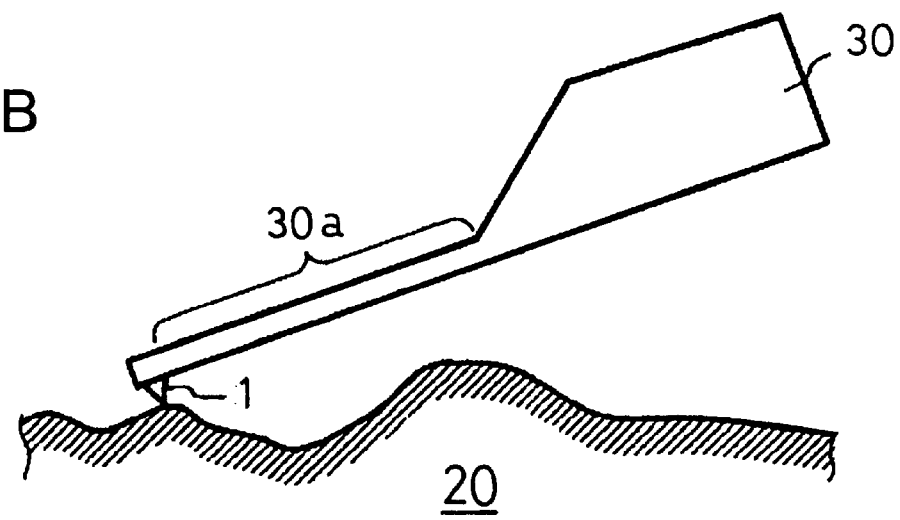
Figure 6:
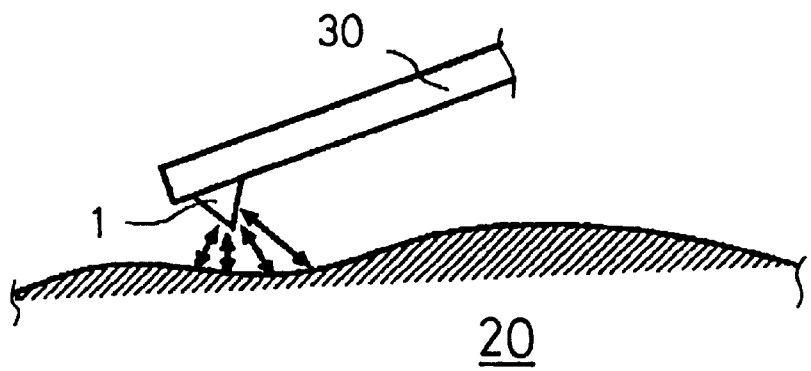
FIG. 6 is a view for explaining the problems of the linear cantilever probe based on the conventional technology.

Then, a mask 63 is formed on the surface of the free edge side supporting section 10b (Refer to FIG. 4A), and a probe 1 is formed by under-cutting the silicon under the mask 63 with dry etching according to a height of the probe 1 (Refer to FIG. 4B). Finally, the mask 63 is removed and the cantilever 10 is completed.

With the embodiment of the present invention, a non-linear cantilever probe having amending section(s) can be formed only by wet type and/or dry type etching steps without requiring complicated polishing steps which are required in the mechanical processing.

Figure 7A:
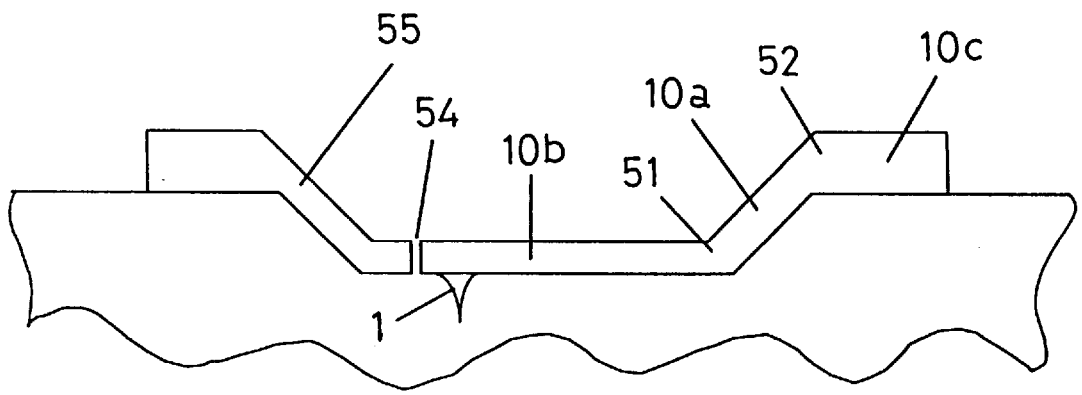
FIG. 7A–7B are a side view and a plane view of a cantilever probe for observation in a liquid according to one embodiment of the present invention.
Figure 7B:
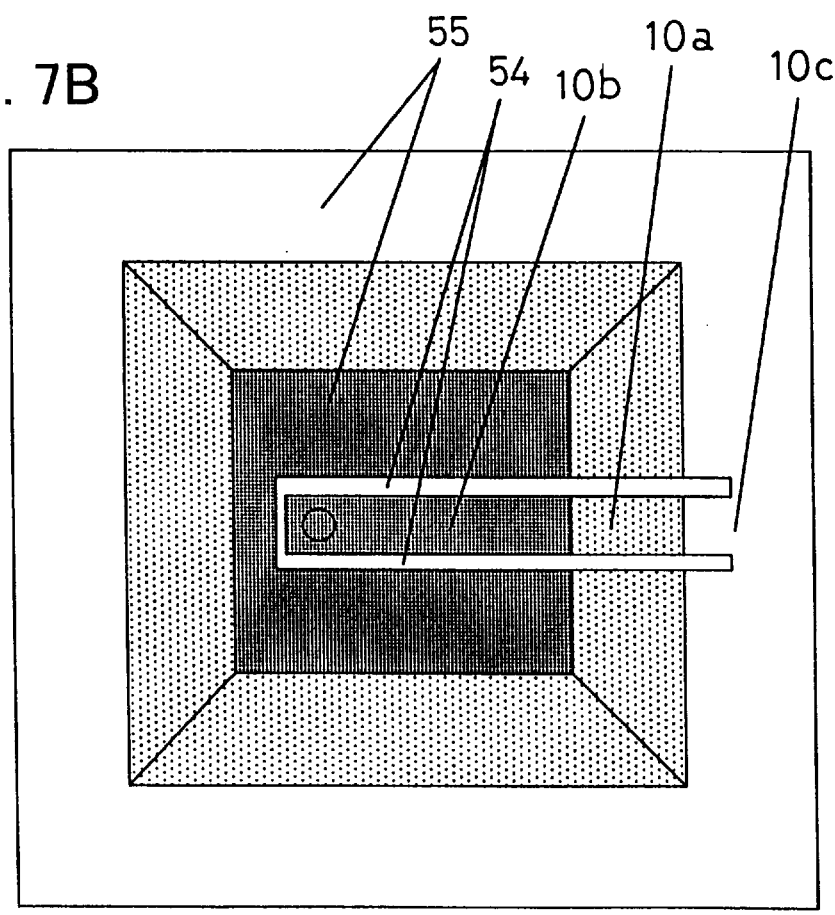

FIGS. 7A and 7B show a cantilever probe according to the present invention having a form effective for observation of a sample in a liquid.

Observation of a surface of a sample in a liquid can be performed by sinking only the probe 1 in the liquid as shown in FIG. 7A while penetration of water due to surface tension is evaded by leaving a peripheral section 55 of the cantilever probe shown in FIG. 1 for a concave form and making a gap 55 between the cantilever probe and the peripheral section thereof as small as around 1 to 100 µm.

It should be noted that description of the above embodiments assumes that a cantilever probe is formed by subjecting a silicon substrate to etching, but the present invention is not limited only to the silicon substrate, and the same type of cantilever probe can be made also by executing etching to a crystal or a gallium arsenide substrate.

With the present invention, the effects described below are achieved.

(1) In the cantilever probe according to the present invention, a bending section(s) is provided between a free edge with a probe provided thereon and a fixed edge, and a beam section is inclined by a specified angle toward a surface of a sample in a state where the probe has vertically approached the surface of the sample, so that, even if the probe has vertically approached the surface thereof, contact between the main body of the cantilever probe and the surface of the sample can be prevented, which allows the probe to accurately trace the surface of the sample.

(2) With the method of manufacturing the cantilever probe according to the present invention, a non-linear cantilever probe having a bending section(s) can be formed only by wet type and/or dry type etching steps without requiring complicated polishing steps which are required for mechanical processing.

(3) In the cantilever probe according to the present invention, an object in water can be observed simply by sinking only the probe in a liquid with the cantilever probe as a whole kept above the liquid.

What is claimed is:

1. A cantilever probe for scanning a sample surface, the cantilever probe comprising: a beam section having a free edge supporting a probe, a fixed edge opposite the free edge, and a pair of bent portions disposed between the fixed edge and the free edge so that when the probe approaches a sample surface in a direction generally perpendicular to the sample surface, the beam section is inclined at a preselected angle relative to the sample surface.

2. A cantilever probe according to claim 1; wherein the beam section has a surface disposed between the bent portions and extending along a <111> plane, and each of the fixed edge and the free edge of the beam section has a surface extending along a <100> plane, and wherein the cantilever probe has a main body made of a semiconductor material and having etched portions forming the free edge, the fixed edge and the bent portions of the beam section.

3. A cantilever probe for scanning a sample surface, the cantilever probe comprising: a concave section having a cantilever, a peripheral section surrounding the cantilever such that a gap exists between the cantilever and the peripheral section, the cantilever having a free end, a first support section disposed at the free end, a probe formed on the first support section for scanning movement relative to a sample surface, a fixed end, a second support section disposed at the fixed end, and a beam section interconnecting the first support member and the second support member to one another.

4. In a scanning type probe microscope having a cantilever probe for scanning a surface of a sample for observing and measuring topographical characteristics of the sample, the cantilever probe comprising: a cantilever having a free end, a first support section disposed at the free end and extending along a first plane, a probe formed on the first support section for scanning movement relative to a sample surface, a fixed end, a second support section disposed at the fixed end and extending along a second plane different from the first plane, and a beam section interconnecting the first support member and the second support member to one another, the beam section being disposed at respective preselected angles relative to the first and second planes, whereby when the probe scans the sample surface the beam section is inclined at a preselected angle relative to the sample surface to thereby prevent contact between the beam section and the sample surface.

5. A cantilever probe for scanning a sample surface, the cantilever probe comprising: a beam section having a free edge supporting a probe, a fixed edge opposite the free edge, and a pair of bent portions disposed between the fixed edge and the free edge so that when the probe approaches the sample surface in a direction generally perpendicular to the sample surface, the beam section is inclined at a preselected angle relative to the sample surface, and a peripheral portion surrounding the beam section and forming with the beam section a concave portion of the cantilever probe such that a gap exists between the peripheral portion and the beam section.

6. A scanning type probe microscope according to claim 3; wherein the first and second planes are generally parallel to one another.

7. In a scanning type probe microscope for observing and measuring topographical characteristics of a sample, a cantilever probe according to claim 3 for scanning a surface of the sample.

8. In a scanning type probe microscope for observing and measuring topographical characteristics of a sample, a cantilever probe according to claim 1 for scanning a surface of the sample.

9. A cantilever probe according to claim 1; wherein the bent portions are disposed at preselected supplementary angles relative to the sample surface.

10. A cantilever probe according to claim 1; wherein the free edge and the fixed edge of the beam section are disposed on different planes.

11. In a scanning type probe microscope for observing and measuring topographical characteristics of a sample, a cantilever probe according to claim 10 for scanning a surface of the sample.

12. In a scanning type probe microscope for observing and measuring topographical characteristics of a sample, a cantilever probe according to claim 2 for scanning a surface of the sample.

13. A cantilever probe according to claim 2; wherein the free edge and the fixed edge of the beam section are disposed on different planes parallel to one another.

14. In a scanning type probe microscope for observing and measuring topographical characteristics of a sample, a cantilever probe according to claim 13 for scanning a surface of the sample.

15. In a scanning type probe microscope for observing and measuring topographical characteristics of a sample, a cantilever probe according to claim 5 for scanning a surface of the sample.

16. A cantilever probe according to claim 5; wherein the free edge and the fixed edge of the beam section are disposed on different planes.

17. In a scanning type probe microscope for observing and measuring topographical characteristics of a sample, a cantilever probe according to claim 16 for scanning a surface of the sample.

18. A cantilever probe according to claim 5;

wherein the beam section has a surface disposed between the bent portions and extending along a <111> plane, and each of the fixed edge and the free edge of the beam section has a surface extending along a <100> plane.

19. A cantilever probe for scanning a sample surface, the cantilever probe comprising: a cantilever having a free end, a first support section disposed at the free end and extending along a first plane, a probe formed on the first support section for scanning movement relative to a sample surface, a fixed end, a second support section disposed at the fixed end and extending along a second plane different from the first plane, and a beam section interconnecting the first support member and the second support member to one another and extending along a third plane different from the first and second planes.

20. A cantilever probe according to claim 19; wherein the beam section is disposed at preselected angles relative to the first and second planes, whereby when the probe scans the sample surface the beam section is inclined at a preselected angle relative to the sample surface to thereby prevent contact between the beam section and the sample surface.

21. A cantilever probe according to claim 20;

wherein the preselected angles comprise supplementary angles.

22. A cantilever probe according to claim 19;

wherein the first and second planes are generally parallel to one another.

23. A cantilever probe according to claim 19;

wherein the beam section has a first end connected to the first support section and a second end connected to the second support section, and wherein the cantilever has a first bent portion disposed between the first support section and the first end of the beam section, and a second bent portion disposed between the second support section and the second end of the beam section.

24. A cantilever probe according to claim 19;

wherein the cantilever comprises a single piece of semiconductor material.

25. A cantilever probe according to claim 19;

wherein the cantilever comprises a main body made of a semiconductor material and having etched portions defining the free end, the fixed end, the first support section, the second support section and the probe.

26. A cantilever probe according to claim 19;

wherein the beam section extends along a third plane different from the first and second planes.

27. A cantilever probe according to claim 26;

wherein the first and second planes are generally parallel to one another.

28. In a scanning type probe microscope for observing and measuring topographical characteristics of a sample, a cantilever probe according to claim 19 for scanning a surface of the sample.

29. A cantilever probe according to claim 3;

further comprising a main body made of a semiconductor material and having etched portions defining the concave section and the peripheral section.

30. A cantilever probe according to claim 3;

wherein the first support section extends along a first plane and the second support section extends along a second plane different from the first plane, and wherein the beam section is disposed at respective preselected angles relative to the first and second planes, whereby when the probe scans the sample surface the beam section is inclined at a preselected angle relative to the sample surface to thereby prevent contact between the beam section and the sample surface.

31. A cantilever probe according to claim 30;

wherein the preselected angles comprise supplementary angles.

32. A cantilever probe according to claim 30;

wherein the first and second planes are generally parallel to one another.

33. A cantilever probe according to claim 3;

wherein the beam section has a first end connected to the first support section and a second end connected to the second support section, and wherein the cantilever has a first bent portion disposed between the first support section and the first end of the beam section, and a second bent portion disposed between the second support section and the second end of the beam section.

34. A cantilever probe according to claim 3; wherein the cantilever comprises a single piece of semiconductor material.

* * * * *